United States Patent [19]

McDonald

[11] Patent Number: 5,390,845
[45] Date of Patent: Feb. 21, 1995

[54] LOW-BRIDGING SOLDERING PROCESS

[75] Inventor: Martin G. McDonald, Riverdale, N.Y.

[73] Assignee: Praxair Technology, Inc., Danbury, Conn.

[21] Appl. No.: 903,450

[22] Filed: Jun. 24, 1992

[51] Int. Cl.$^6$ .................................................. B23K 1/00
[52] U.S. Cl. ..................................... 228/217; 228/219; 228/223
[58] Field of Search ..................... 228/180.1, 219, 217, 228/263.17, 262.51, 223

[56] References Cited

U.S. PATENT DOCUMENTS

| | | | |
|---|---|---|---|
| 3,811,177 | 5/1974 | Schoer et al. ........................ | 228/219 |
| 4,373,974 | 2/1983 | Barajas ................................. | 148/24 |
| 4,504,007 | 3/1985 | Anderson, Jr. et al. ............. | 228/123 |
| 4,610,391 | 9/1986 | Nowotarski .......................... | 228/219 |
| 5,071,058 | 12/1991 | Nowotarski .......................... | 228/219 |
| 5,076,487 | 12/1991 | Bandyopadhyay et al. ........ | 228/248 |
| 5,240,169 | 8/1993 | Gileta ................................. | 228/180.1 |

FOREIGN PATENT DOCUMENTS

| | | | |
|---|---|---|---|
| 0361507 | 4/1990 | European Pat. Off. ............. | 228/219 |
| 53-95854 | 8/1978 | Japan .................................. | 228/219 |
| 62-101372 | 5/1987 | Japan . | |
| 1250610 | 10/1971 | United Kingdom ................ | 228/219 |

OTHER PUBLICATIONS

"Wettability of Liquid Tin On Solid Copper" by Kawakatsu & Osawa, *Transactions of the JIM* vol. 14, 1973, pp. 114–119.

"Oxidation And Drossing Of Molten Solders: Effects of Impurities" by Stoneman et al., *Metals Technology*, Jun. 1980, pp. 226–231.

"Copper Phosphorous Brazing Filler Alloys With Low Melting Temperature (Report 1)–Effect of Tin Addition" by Okamoto et al., *Transactions of JWRI*, vol. 10, No. 1, 1981, pp. 47–53.

"Solder Contamination–Cause and Effect" by C. Mackay, Technical Paper Presented at IPC Fall Meeting Sep. 1981.

"New Developments In Direct-Free Soldering" and soldering product information by Federated Fry Metals Co.

"Viscosity of Tin/Lead Solder", Fry Report No. 89-V11, by Federated-Fry Metals Co.

"Joining Chip To Substrate In Oxygen-Containing Atmosphere" by Brunner et al., IBM Technical Disclosure Bulletin, vol. 20, No. 6, Nov. 1977, p. 2318.

"Solders And Their Future Use" in Tin And Its Uses, Issue 135 (1983) p. 5.

"Effects of Impurities On Wetting And Drossing of Solder", *Tin And Its Uses*, Issue 135, (1983), p. 4.

"The Soldering Process", *Tin And Its Uses* Issue 136, (1983) p. 9.

"New Products", *Electronic Chemical News*, Feb. 15, 1992, p. 6.

*Primary Examiner*—Kenneth J. Ramsey
*Assistant Examiner*—Jeffrey T. Knapp
*Attorney, Agent, or Firm*—Peter Kent; Cornelius O'Brien

[57] ABSTRACT

A process for wave soldering or reflow soldering comprises contacting substrates with a supply of molten solder containing from about 0.0001 to about 0.1% by weight of phosphorous in an atmosphere of diluent gas containing up to about 0.1% by volume oxygen. A reduced incidence of bridging and other soldering defects occurs.

9 Claims, No Drawings

LOW-BRIDGING SOLDERING PROCESS

TECHNICAL FIELD

This invention relates to a method of joining or coating substrates with solder, particularly to substrates on a printed wiring board.

BACKGROUND OF THE INVENTION

In the electronics industry, printed wiring boards are widely used. Substrates and component leads on the boards are coated and/or joined by solder in rapid, automated mass production processes. Scrutiny of every joint is not feasible so that highest levels of reliability and quality and the avoidance of defects are sought.

To meet the continuing drive for greater compactness, the proximity of substrates and joints on boards has increased. This has resulted in increasing propensity for the formation of undesired connections or bridges between substrates and joints. Hence the electronics industry has avidly sought processes that reduce the occurrence of this particular defect, among others, in the prevailing method of mass production soldering, namely wave soldering.

The next most prevalent method of soldering, reflow soldering, in addition to bridging, experiences other defects peculiar to it, namely, dewetting of substrates by solder, discoloration of boards and white haze on boards. Dewetting of substrates by the solder results in discontinuous coating by solder of substrates, and reduced adherence of solder to substrates, and consequently, joints of low strength and reliability. Discoloration on circuit boards after the reflow process raises concerns that the board has been damaged in some manner. Since the manner of damage is often not apparent, discoloration is tolerated to a large extent. White haze occurring on boards during the soldering process is a form of discoloration of particular concern. Many coatings used to protect soldered circuit boards do not adhere well to the white haze areas on the board.

An improved wave soldering process directed to reduced bridging defects and dross generation and an improved reflow soldering process directed to reduced dewetting of substrates by solder, white haze on boards and discoloration on boards was disclosed in U.S. Pat. No. 5,071,058, dated Dec. 10, 1991, issued to Nowotarski, titled "Process For Joining/Coating Using An Atmosphere Having A Controlled Oxidation Capability." In the disclosed processes, the soldering was conducted in a controlled oxidizing atmosphere having an oxygen concentration of from about 0.001% to about 10% by volume. Conventional fluxes and solders were used, and no additives were disclosed.

While the processes disclosed in the cited patent provided reductions in the defects named, including bridging, the instant invention provides still lower levels of such defects.

SUMMARY OF THE INVENTION

This invention provides improved processes for coating a substrate or joining at least two substrates with solder as typically found on a printed wiring board. The invention is practicable in wave soldering and reflow soldering operations. The process comprises contacting the substrate or substrates with a supply of molten solder containing from about 0.0001 to about 1% by weight of at least one material selected from the group consisting of phosphorous, calcium, silver, bismuth, copper, gold, mercury, barium, lithium, sodium, tellurium, potassium, rubidium, cesium, and aluminum antimony, or zinc and cadmium, in an atmosphere of diluent gas containing from about 0.1 to about 10% by volume oxygen.

In wave soldering the invention results in reduced incidence of bridging. In reflow soldering, the invention results in reduced bridging, dewetting of substrates, discoloration of boards and white haze on boards.

DETAILED DESCRIPTION OF THE INVENTION

The invention is described embodied in a particularly advantageous application—the wave soldering of a printed wiring board. A board with substrates (including component leads) to be solder coated or joined is preferably lightly coated with a flux, preferably a low solids flux, such as a rosin flux containing less than 4% solids, or a no-clean flux. A no-clean flux after solder contact leaves a low level of residue which is non-corrosive and non-conductive.

A solder wave is formed in a solder pot containing molten solder. A protective gaseous atmosphere is provided around the solder wave, preferably around the entire exposed surface of the molten solder in the pot. The protective atmosphere may extend to other portions of a wave soldering operation, however, such as a board fluxing or a board preheating operation.

The protective atmosphere comprises a diluent gas and may contain up to to about 10% by volume oxygen, preferably from about 0.1. to about 10% oxygen, most preferably from about 0.1 to about 3% oxygen. The diluent gas is a nonoxidizing or mildly oxidizing gas, for example, nitrogen, argon, carbon dioxide, helium, hydrogen, water vapor or mixtures thereof, and may include adipic acid and formic acid in gaseous form. The lower concentrations of oxygen in the protective atmosphere are preferred in that sporadic environmental air currents which may temporarily penetrate and raise the oxygen concentration in the protective atmosphere do not raise the oxygen concentration to a level that allows bridging to occur.

The solder comprises any of the known compositions, such as tin and lead in a ratio of 63 to 37 parts by weight and contains up to about 3% of other materials, most preferably including phosphorous. Phosphorous lowers the incidence of bridging, that is, the formation by the solder of undesired connections on the board. Phosphorous also lowers the rate of formation of dross in the molten solder, which reduces the maintenance and costs involved in removing the dross from the equipment and replacing the solder consumed in the dross.

Without desiring to be held to this hypothesis, it is believed that phosphorous lowers the incidence of bridging by reducing the surface tension of the molten solder existing under the specified protective atmosphere. Other materials which lower the surface tension of molten solder and are useful in this invention to reduce the incidence of bridging are: calcium, silver, bismuth, copper, gold, mercury, barium, lithium, sodium, tellurium, potassium, rubidium, cesium, and aluminum antimony, or zinc and cadmium. Also useful are mixtures of the above-mentioned materials including mixtures with phosphorous. Of this group, the preferred materials are calcium, silver, bismuth, copper, gold, and aluminum combined with antimony or with antimony and zinc and/or cadmium. The most preferred material is phosphorous in that it reduces both the formation of bridges and dross.

The operable range of content of surface tension lowering material is from about 0.0001 to about 1% by weight. The preferred range is from about 0.001 to about 0.1%, and the most preferred range is from about 0.002 to about 0.01%.

The phosphorous or other surface tension reducing material can be introduced as part of the solder composition, or added to the solder in the solder pot, or into the flux applied to the substrate, or into the flux vehicle (thickening agent, binder, etc.). Phosphorus can be introduced in combined form, for instance, as tin phosphide, or as an organic phosphide, such as dioctyl phosphite, diphenyl phosphite, butylphenyl phosphite, and octylphenyl phosphite.

The printed wiring board is contacted with the solder wave in the protective atmosphere and disengaged from the solder in the protective atmosphere. Apparatus for creating a solder wave and contacting a board with the wave as is typical for soldering in air is suitable. As is the practice for soldering in air, to minimize the effect of dross, it is desirable for the board to initially contact and break the solder oxide layer on the solder surface near the wave crest, and in its travel through the wave, carry or push the solder oxides on the solder surface over the crest of the wave.

The invention can also be practiced in a dip soldering operation or a drag soldering operation. Furthermore, vibrating or oscillating molten solder may be employed to enhance the coating or filling by solder of plated holes penetrating the printed circuit board.

The invention is also applicable to reflow soldering. In reflow soldering the substrates are coated with flux and with solder of compositions as described except that the solder is in a powder or paste form. The prepared substrates are next heated in a protective atmosphere as described until the solder is molten. The substrates and molten solder are then allowed to cool in the protective atmosphere at least until the solder is solidified. This reflow process results in reduced incidence of bridging and dewetting.

EXAMPLE

Groups of sixteen printed wiring boards are wave soldered under various conditions of interest in this invention. Each group of sixteen contains four subgroups. Each subgroup comprises four varieties of board typically used in industry. Each group of sixteen boards has 11,000 joints to be soldered. All boards are coated with a light application of no-clean flux containing not more than 2% solids and then are contacted with a pumped solder wave comprising tin and lead in a ratio of 63 to 37 parts by weight. The results in terms of number of bridges occurring per 11,000 joints contacted with solder containing no phosphorous and with solder containing 0.002% by weight phosphorous are given in the following table for several oxygen concentrations in the atmosphere surrounding the solder wave.

| Number of Bridges Per 11,000 joints | | | | | |
|---|---|---|---|---|---|
| | Oxygen Concentration, Volume % | | | | |
| | 0 | 0.5 | 1 | 1 | 3 | 5 |
| Solder | | | | | | |
| With P | 10 | 2 | 0 | 0 | 5 | 63 |
| Without P | 6 | 7 | 27 | 42 | 50 | 72 |

The data show that when using solder containing phosphorous, the incidence of bridging is low over the range of oxygen tested, here up to 5% by volume. When using solder containing phosphorous, the incidence of bridging is markedly low over the range of oxygen concentration from about 0.5% to about 3%. At all oxygen concentrations tested except at zero oxygen concentration, when using solder containing phosphorous, the incidence of bridging is reduced compared to the incidence when using solder containing no phosphorous. Over the oxygen concentration range of from about 0.5% to about 3%, when using solder containing phosphorous, the incidence of bridging is markedly reduced compared to the incidence when using solder containing no phosphorous. A decided advantage of using solder containing phosphorous compared to using solder containing no phosphorous is that the minimum incidence of bridging occurs at higher oxygen concentrations. This allows the use of a less costly protective atmosphere for the soldering operation. All of these results were unpredictable and unexpected.

Although the invention has been described with reference to specific embodiments as examples, it will be appreciated that it is intended to cover all modifications and equivalents within the scope of the appended claims.

What is claimed is:

1. A process for reducing the incidence of bridging in joining at least two substrates with solder, said process comprising providing a supply of molten solder containing from about 0.0001 to about 1% by weight of at least one material selected from the group consisting of phosphorous, calcium, bismuth, copper, gold, mercury, barium, lithium, sodium, tellurium, potassium, rubidium, cesium, aluminum, zinc and cadmium and contacting the substrate or substrates with said supply of solder in an atmosphere of diluent gas, said atmosphere containing up to about 10% by volume oxygen, wherein said step of providing a supply of molten solder containing said material comprises providing a supply of molten solder, and, prior to contacting with molten solder, contacting the substrate or substrates with a flux or flux vehicle containing said material.

2. The process as in claim 1 wherein said atmosphere gas contains from about 0.1 to about 3% oxygen.

3. The process as in claim 1 wherein said solder contains from about 0.001 to about 0.1% of said material selected from said group.

4. The process as in claim 1 wherein said solder contains from about 0.002 to about 0.01% of said material selected from said group.

5. The process as in claim 1 wherein said supply of molten solder is in the form of a solder wave and said process further comprises disengaging the substrate or substrates from said solder wave.

6. The process as in claim 1 wherein said atmosphere includes at least one of the gases selected from the group consisting of nitrogen, argon, carbon dioxide, helium, hydrogen, water vapor, formic acid and adipic acid.

7. The process as in claim 1 wherein contacting the substrate or substrates with said supply of molten solder comprises bringing said substrate or substrates into contiguity with a supply of solid or paste solder and heating said substrate or substrates and said solid or paste solder until said solid or paste solder becomes molten.

8. The process as in claim 1 wherein said solder has a base of tin and lead.

9. The process as in claim 1 wherein said solder contains from about 0.001 to about 0.002% of said material selected from said group.

* * * * *